United States Patent
Yu et al.

(10) Patent No.: US 8,610,488 B2
(45) Date of Patent: Dec. 17, 2013

(54) 3X INPUT VOLTAGE TOLERANT DEVICE AND CIRCUIT

(75) Inventors: Ming-Hsin Yu, Taichung (TW); Guang-Cheng Wang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 13/349,152

(22) Filed: Jan. 12, 2012

(65) Prior Publication Data

US 2013/0181768 A1 Jul. 18, 2013

(51) Int. Cl.
*H03K 17/08* (2006.01)
*H03K 17/687* (2006.01)
*H03K 19/094* (2006.01)

(52) U.S. Cl.
USPC ............ 327/410; 327/112; 327/437; 327/590

(58) Field of Classification Search
None
See application file for complete search history.

(56) References Cited

U.S. PATENT DOCUMENTS

| | | | | |
|---|---|---|---|---|
| 6,320,414 | B1 * | 11/2001 | Annema et al. | 326/80 |
| 7,495,483 | B2 * | 2/2009 | Kumar et al. | 327/112 |
| 7,652,511 | B2 * | 1/2010 | Chuang et al. | 327/112 |
| 7,746,124 | B2 * | 6/2010 | Ajit | 327/108 |
| 8,344,760 | B2 * | 1/2013 | Du et al. | 327/108 |

* cited by examiner

*Primary Examiner* — Lincoln Donovan
*Assistant Examiner* — Terry L Englund
(74) *Attorney, Agent, or Firm* — Duane Morris LLP

(57) ABSTRACT

A voltage tolerant input/output circuit coupled to an input/output pad, and is able to support a voltage overdrive operation of approximately twice an operational voltage, and have an input tolerance of approximately three times the operational voltage. The circuit includes a pull-up driver, a P-shield, an N-shield, a pull-down driver and a cross-control circuit. The pull-up driver is coupled to a power supply. The P-shield has an N-well and is coupled to the pull-up driver at a node C, and coupled to the input/output pad. An N-shield is also coupled to the input/output pad. A pull-down driver is coupled between ground and the N-shield at a node A. A cross-control circuit is configured to detect voltages at: the node A, the node C, and the input/output pad. The cross-control circuit is configured to output control signals to the P-shield and the N-shield based on the detected voltages.

21 Claims, 12 Drawing Sheets

I/O output stage (1X device)

3X INPUT VOLTAGE TOLERANT DEVICE AND CIRCUIT

BACKGROUND

TECHINAL FIELD

Aspects of the present disclosure relate in general to electronic circuitry. In particular, aspects of the disclosure include an input voltage tolerant circuitry and device able to receive a voltage input three times (3×) larger than the device operating voltage.

DESCRIPTION OF THE RELATED ART

Advanced Integrated Circuits (IC) fabrication processes have been constantly evolving. As the electronics market demands higher performance and lower power consumption, IC fabrication processes increase their integration density, which also results in more reliable circuits. As circuit integration density rises, designers lower the voltage of the power supply needed to run the IC chips. Lowering power supply voltage allows the fabrication process to have smaller geometries and better performance without compromising the reliability or the quality of the integrated circuits.

One consequence of using the lower power supply voltage is the susceptibility of input and output pads to damage from external voltages higher than the power supply of the integrated circuit. This situation occurs when an external device, which operates at a higher power supply voltage and is electrically coupled to the input/output pad, drives the pad to a greater voltage than the power supply of the integrated circuit. The situation may also occur from transient spikes on the power supply of the IC. Damage results if excessive voltages occur across any two of the three terminals of the transistor (Gate, Source, Drain).

Damage also results to the transistor gate oxide due to hot carrier injection, if the transistor draws large amounts of current from its drain to its source. Excessive voltages introduced across the transistor source and drain when the transistor is on allows excessive current to flow. The excessive current results in permanent damage to the transistor.

A contextual example of the above situation may be seen in the migration of integrated circuits from 5 volts to 3.3 volts, or 3.3 volts to 1.8 volts. As the 5 volt to 3.3 volt migration took place, applications were being built that have both 5 volts and 3.3 volts driving the same bus. This was possible since the logic levels driving and received by 5 volt and 3.3 volt chips are usually the same. For example, both 5 volt and 3.3 volt chips consider a logic "1" to be any voltage above 2.5 volts, while a logic "0" is any voltage below 0.4 volts. As a result of mixed IC applications, however, ICs powered by 3.3 volt sources need to be tolerant to the 5 volt signals. Since these signals can also be very high speed signals, the 3.3 volt chips must also be tolerant of the increased transmission line spikes and reflections caused by the increased speed.

A 3.3V input/output interface is built with 3.3V (or can be overdriven to 3.3V, such as 2.5V overdriven to 3.3V) process. If a 1.8V system has to migrate to another system with 3.3V interface there are a plethora of problems. In some cases, the current circuit solution is overdriving 1.8V to 3.3V (0-2×), as shown in the circuit 1000 of FIG. 1 (PRIOR ART). Similarly, a 0-3× overdrive circuit is shown in FIG. 2 (PRIOR ART). However with these circuits reliability is a major issue, as hot carrier injection (HCI) may take place. Moreover these circuits consume a high amount of direct current (DC) power if specific middle bias is needed.

SUMMARY

A voltage tolerant input/output circuit coupled to an input/output pad, and is able to support a voltage overdrive operation of approximately twice an operational voltage, and have an input tolerance of approximately three times the operational voltage. The circuit includes a pull-up driver, a P-shield, an N-shield, a pull-down driver and a cross-control circuit. The pull-up driver is coupled to a power supply. The P-shield has an N-well and is coupled to the pull-up driver at a node C, and coupled to the input/output pad. An N-shield is also coupled to the input/output pad. A pull-down driver is coupled between ground and the N-shield at a node A. A cross-control circuit is configured to detect voltage at: the node A, the node C, and the input/output pad. The cross-control circuit is configured to output control signals to the P-shield and the N-shield based on the detected voltages.

DETAILED DESCRIPTION

Figure 1:
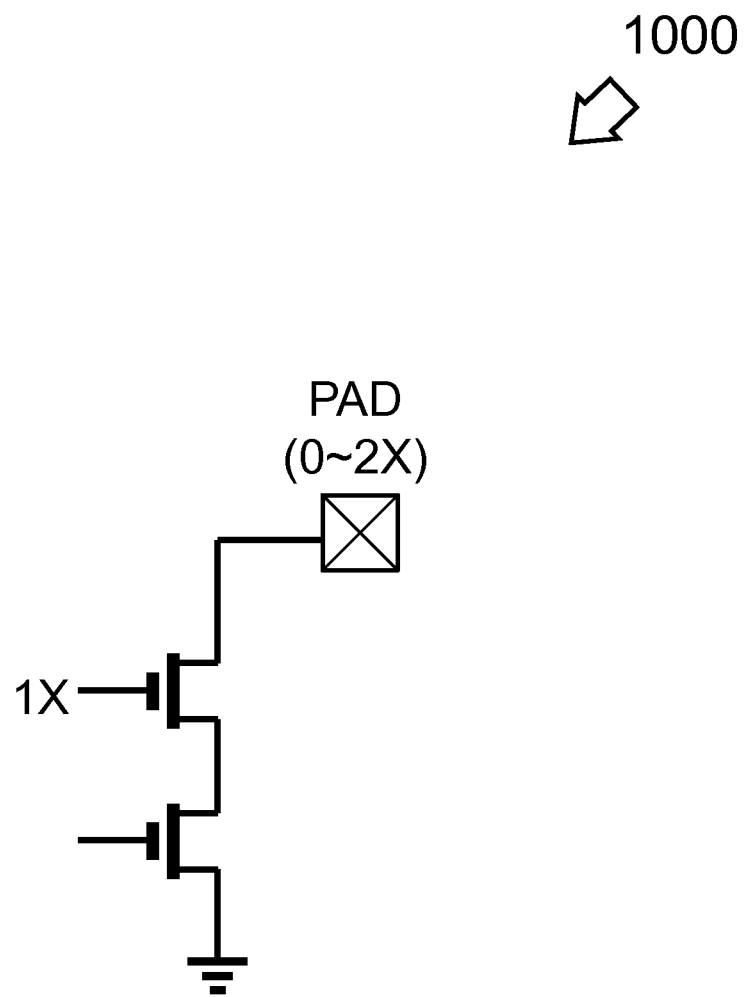
FIG. 1 depicts a conventional input voltage tolerant structure of the PRIOR ART.
Figure 2:
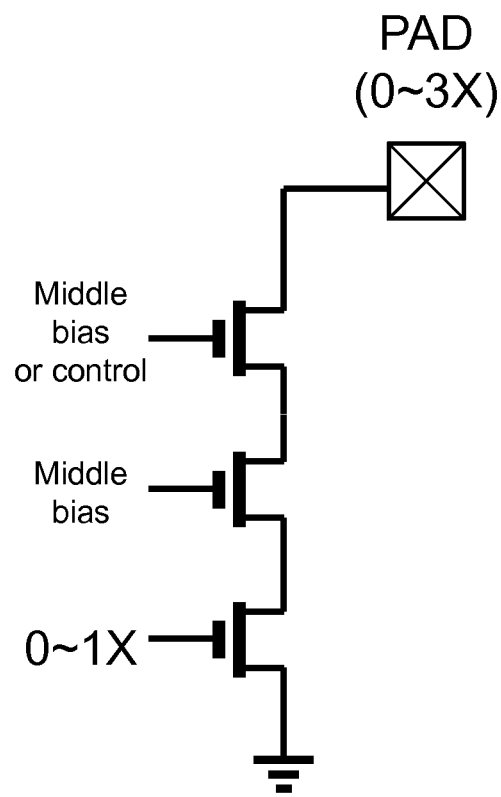
FIG. 2 shows another conventional input voltage tolerant structure of the PRIOR ART.

One aspect of the present disclosure includes a voltage tolerant input/output circuit configured to three times the internal device voltage.

The following embodiments are described in a plurality of sections. Further, circuit elements making up each of functional blocks of the following embodiments are formed on a semiconductor substrate made of a single crystal silicon by use of the known integrated circuit (IC) technology for Complementary Metal Oxide Semiconductors (CMOS) transistors. With the present embodiments, a MOSFET (Metal Oxide Semiconductor Field Effect Transistor) (abbreviated to MOS transistor) is used as an example of a Metal Insulator Semiconductor Field Effect Transistor (MISFET). However, a non-oxide film is not precluded as a gate insulating film. In the drawings, a symbol O is affixed to a p-channel MOS transistor (PMOS transistor or "p-type" transistor) to be thereby differentiated from an n-channel MOS transistor (NMOS transistor or "n-type" transistor). Further, in the drawings, connection of a substrate potential of a MOS transistor is not specifically shown, however, there is no particular limitation to a connection method thereof if the MOS transistor is present in a normally operable range.

Embodiments of the invention will be described hereinafter with reference to the drawings. In all the drawings for use describing the embodiments, identical members are in principle denoted by like reference numerals, thereby omitting detailed description thereof.

For the sake of convenience, we will refer to the device operating voltage as "1×" voltage. Similarly, twice operating voltage is "2×" voltage, and three-times the operating voltage is "3×." It is understood by those familiar with the art that the voltages are approximates. For example, a typical "1×" voltage might be around 1.8 volts, while a "2×" voltage would be approximately 3.3 volts, and a "3×" voltage would be about 5 volts. It is understood that embodiments may use different voltages, and the input tolerant circuitry would be design to facilitate the range of voltage inputs/outputs.

Embodiments will now be disclosed using a power supply (PWR) that is twice (2×) the operating voltage.

Figure 3:
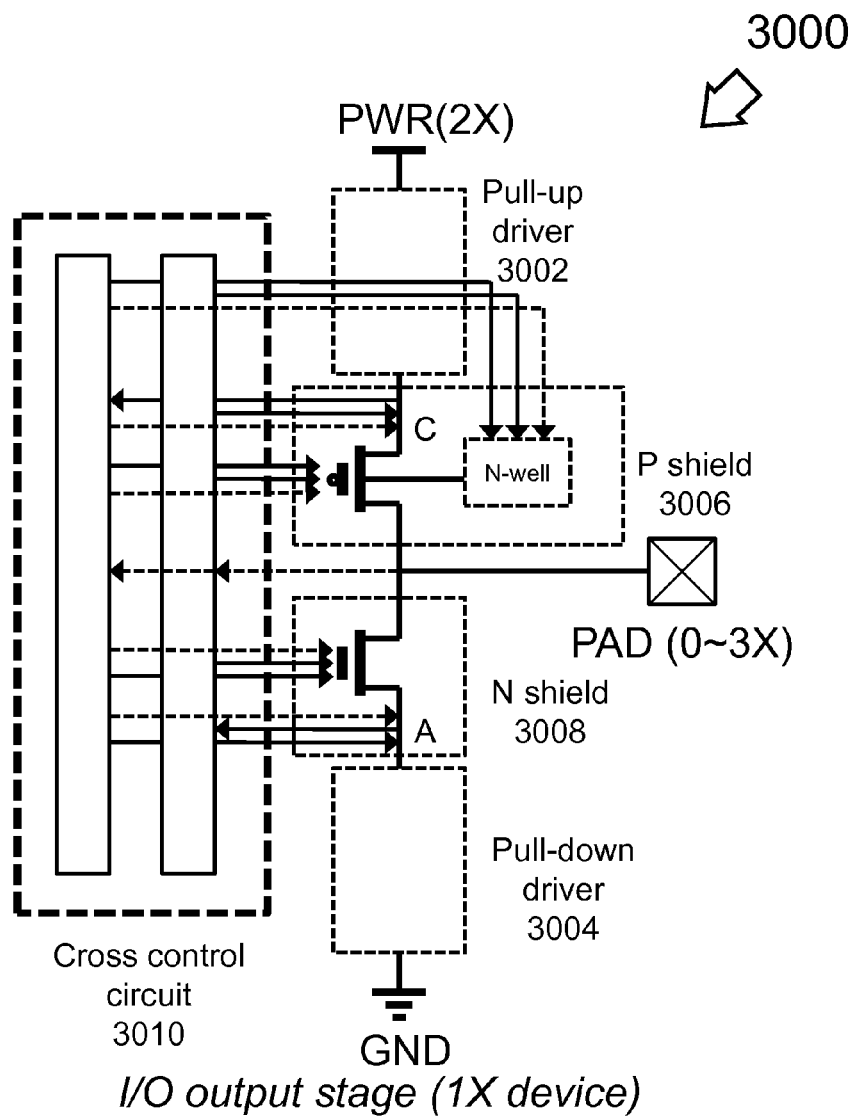
FIG. 3 is an embodiment of an input voltage tolerant device capable of supporting a 2× voltage overdrive operation with a 3× voltage tolerate input feature.

Let us now turn to an embodiment of a voltage tolerant input/output circuit 3000, shown in FIG. 3. FIG. 3 is an embodiment of an input voltage tolerant device capable of supporting a 2× voltage overdrive operation with a 3× voltage tolerate input feature, designed in accordance with an embodiment of the present disclosure. As shown in FIG. 3, voltage tolerant input/output circuit 3000 is coupled to an input/output pad, and includes a pull-up driver 3002, a pull-down driver 3004, a P-shield 3006, an N-shield 3008, and a cross control circuit 3010. Details of these elements are elaborated on below.

P-shield 3006 may have an N-well, as is known in the art.

Cross control circuit 3010 receives and detects the voltage at three node points: node A, node C, and the input/output pad. Cross control circuit 3010 uses these monitors these voltages and outputs control signals to the P-shield 3006 and N-shield 3008 to ensure reliability of the circuit. The operation of cross control circuit 3010 is described in greater detail below in FIG. 5. Embodiments of pull-up driver 3002, a pull-down driver 3004, a P-shield 3006, an N-shield 3008, and a cross control circuit 3010 are discussed with respect to FIG. 6-8 below.

Figure 4:
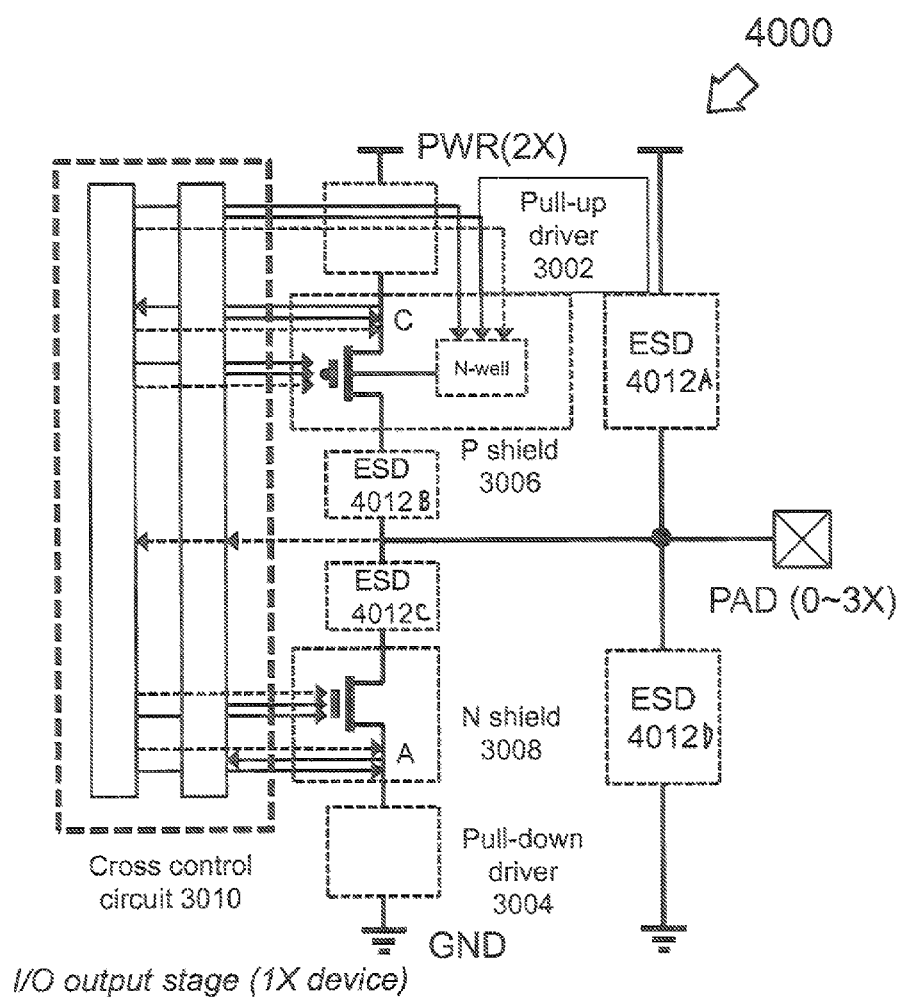
FIG. 4 is an alternate embodiment of an input voltage tolerant device with an electro static discharge (ESD) device.

FIG. 4 depicts an alternate embodiment of an input voltage tolerant device 4000 coupled with an electro static discharge device, designed in accordance with an embodiment of the present disclosure. Essentially, input voltage device 4000 is similar to input voltage device 3000 with the addition of an ESD device to shield components from direct contact with the input/output pad. As shown in FIG. 4, voltage tolerant input/output circuit 4000 again includes a pull-up driver 3002, a pull-down driver 3004, a P-shield 3006, an N-shield 3008, and a cross control circuit 3010. The elements are shielded from direct contact with the input/output pad via an electro static discharge device 4012. For convenience sake, FIG. 4 depicts the electro static discharge device 4012 as a number of discrete devices 4012A-D. It is understood by those well-rehearsed in the art that any electro static discharge device 4012 may be a resistor or any other electro static discharge device known in the art.

FIGS. 5A-5E are usage examples of an embodiment of an input voltage tolerant device 3000, designed in accordance with an embodiment of the present disclosure.

Figure 5A:
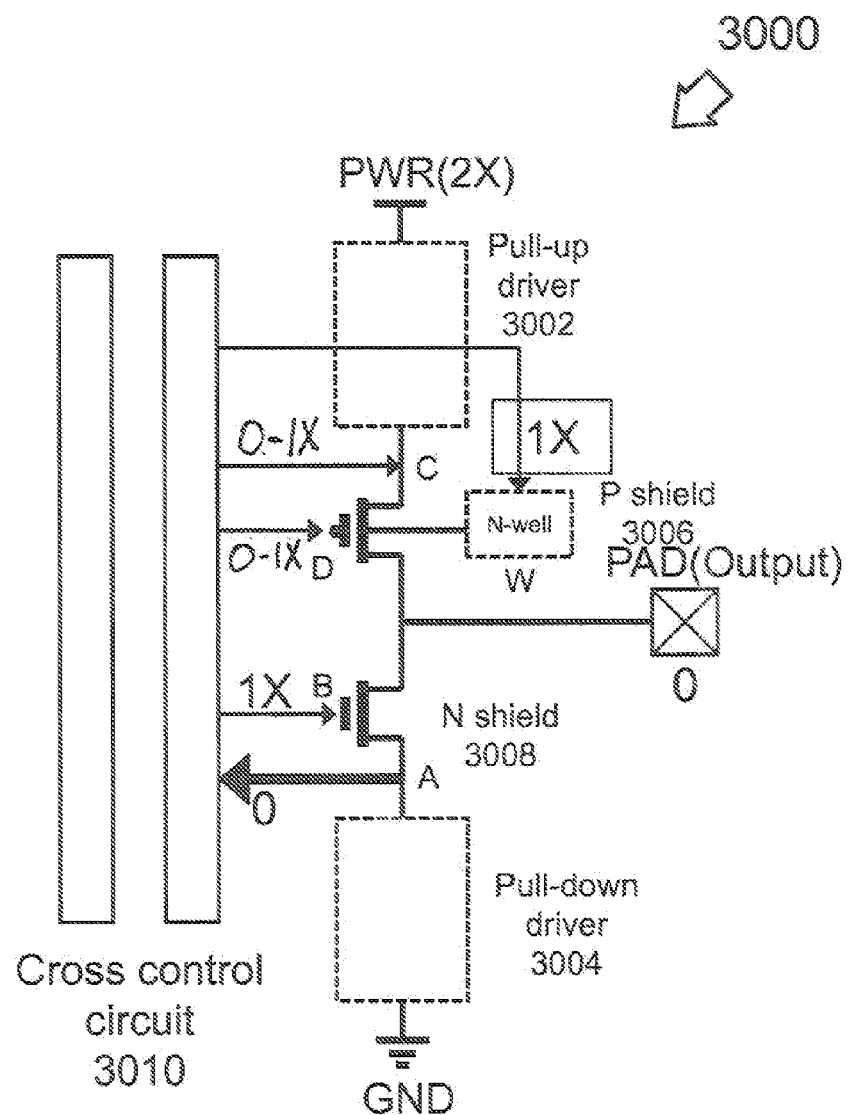
FIGS. 5A-5E are usage examples of an embodiment of an input voltage tolerant device.

FIG. 5A depicts input voltage tolerant device 3000 in use in a low output mode, where the output voltage at the pad is zero volts. In such an embodiment, pull down driver 3004 pulls the voltage at node A to zero (low voltage). Cross control circuit 3010 detects the low voltage at node A, and outputs 1× voltage to node B (controlling the gate of the N-shield 3008, turning it on), and node W (an N-well within the P-shield 3006). Furthermore, cross control circuit 3010 may also output 0-1× voltage to node C and node D (controlling the gate of the P-shield 3006, turning it off). This sequence of cross control circuit 3010 outputs would result in the input/output pad being pulled low (zero volts).

Figure 5B:
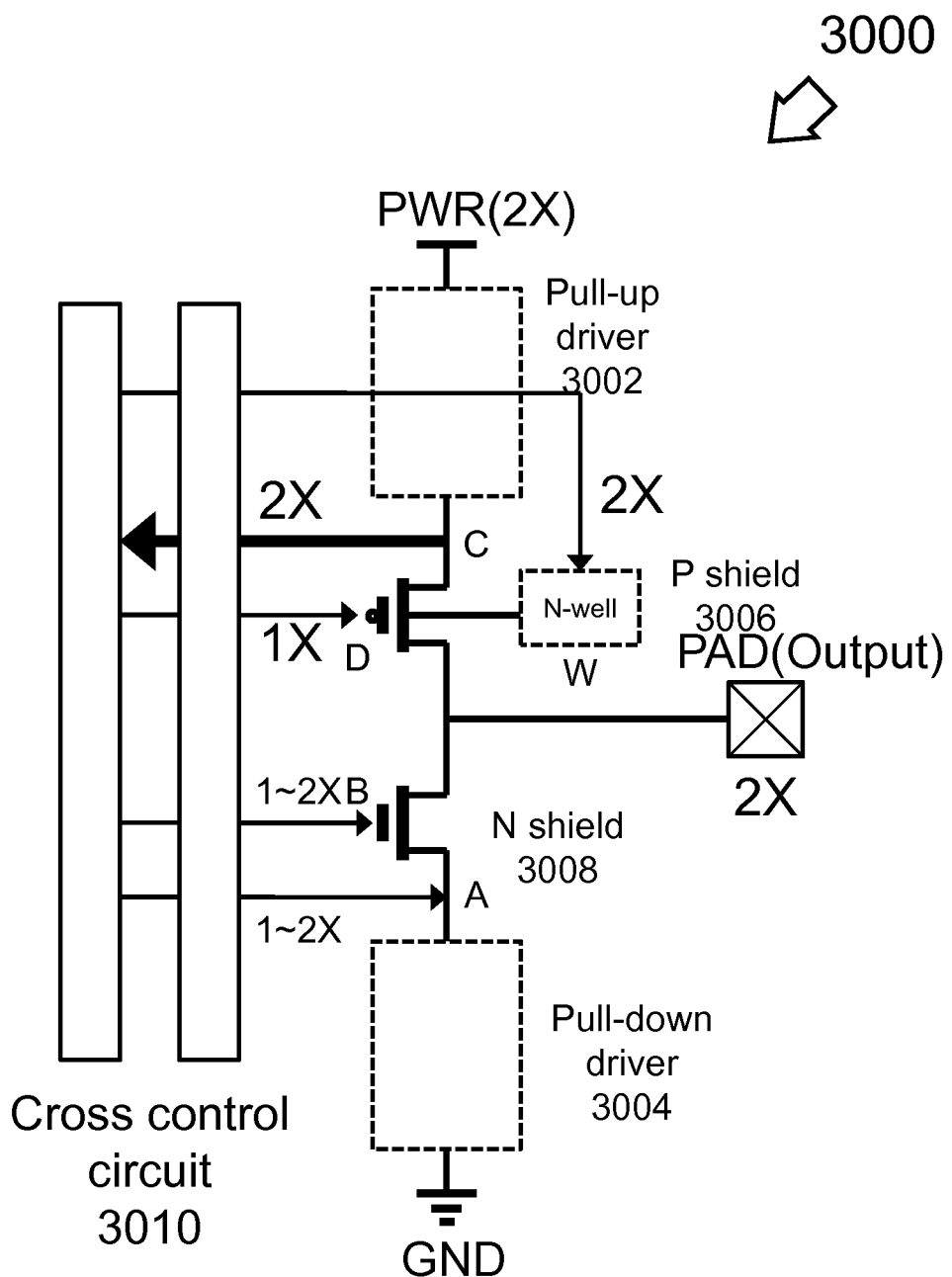

The input voltage tolerant device 3000 in FIG. 5B is being used to output 2× voltage. In such an use, the cross control circuit 3010 detects a high voltage at node C. Cross control circuit 3010 then outputs 1×-2× voltage to node A and node B (controlling the gate of the N-shield 3008, turning it off). At node D, cross control circuit 3010 outputs 1× voltage to node D (controlling the gate of the P-shield 3006, turning it on), and 2× voltage at node W (the N-well within the P-shield 3006). This results in output pad voltage being pulled to 2×.

Figure 5C:
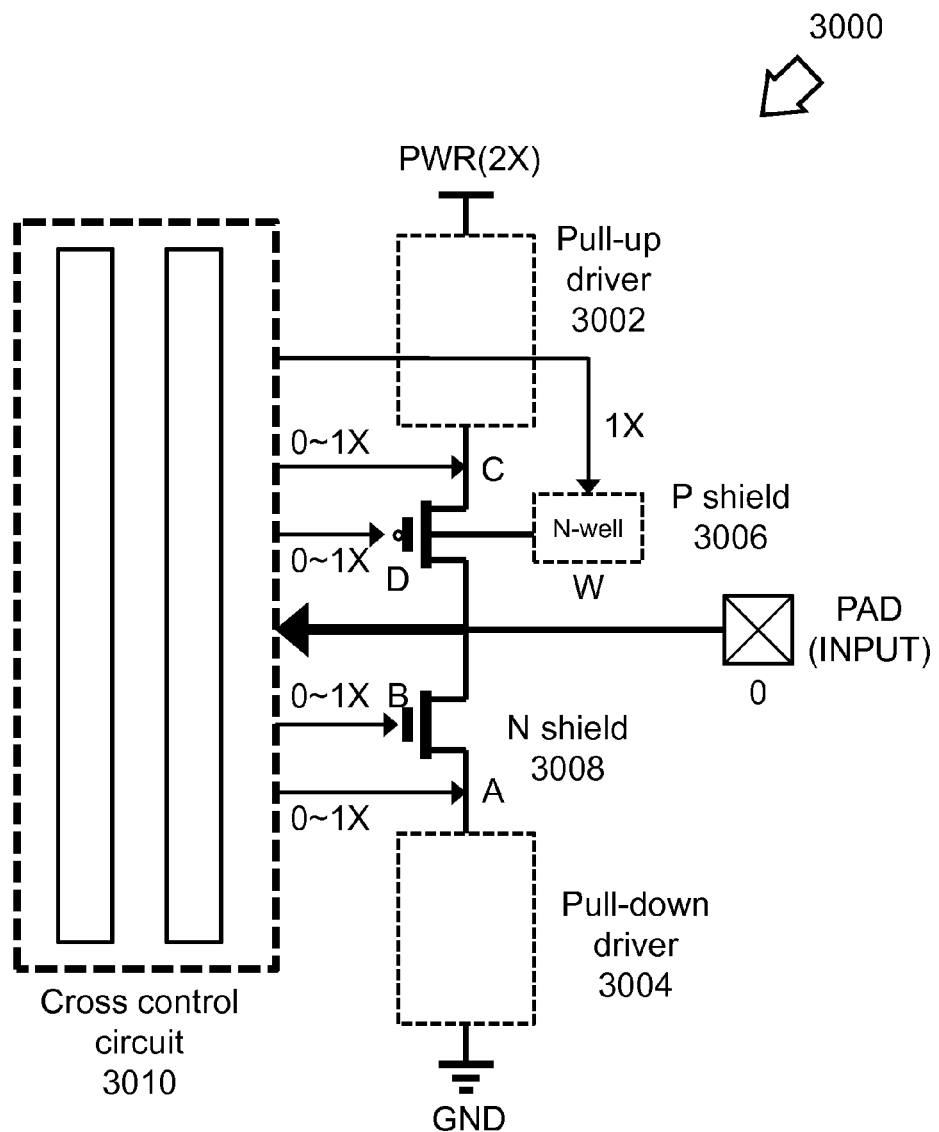

FIG. 5C shows operation of input voltage tolerant device 3000 in a low input mode, where the input voltage received at the pad is zero volts. Initially, cross control circuit 3010 detects input voltage at the pad being zero volts. The pull-up driver 3002 and pull-down driver 3004 are turned off. Low input at the pad triggers cross control circuit 3010 to control nodes A, B, C, and D, between 0-1× voltage, and control node W as 1× voltage.

Figure 5D:
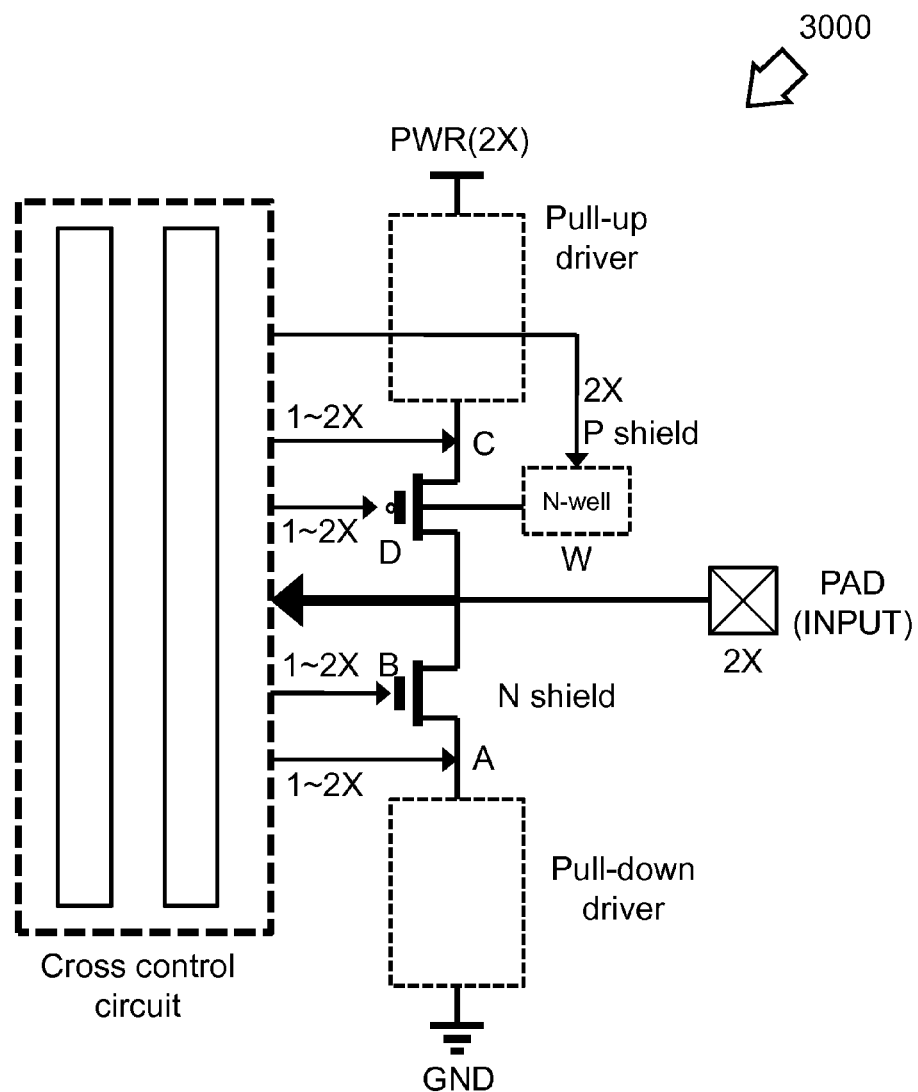

In another use of voltage tolerant device 3000, the input voltage at the pad is 2×. FIG. 5D depicts this scenario. Cross control circuit 3010 detects the 2× input voltage. The pull-up driver 3002 and pull-down driver 3004 are turned off. The high (2×) input at the pad triggers cross control circuit 3010 to control nodes A, B, C, and D, between 1-2× voltage, and control node W as 2× voltage.

Figure 5E:
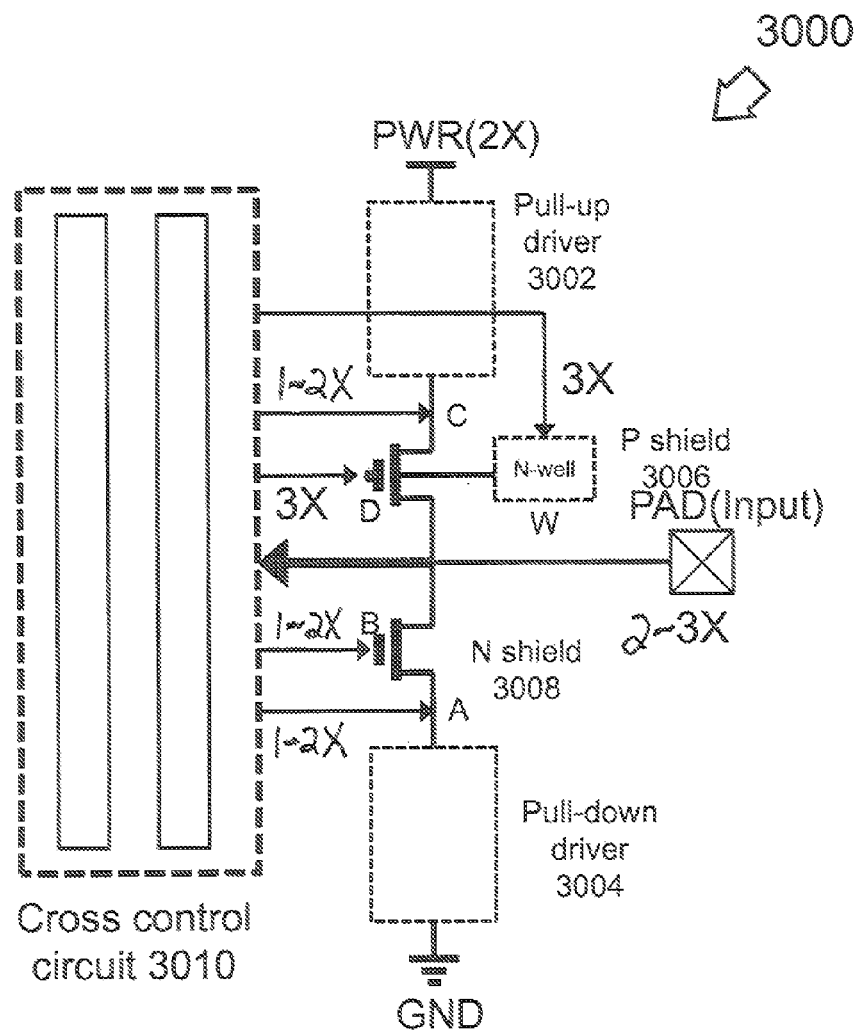

FIG. 5E depicts input voltage tolerant device 3000 in use in a very high input mode, where the voltage at the pad is three times the operating voltage. Cross control circuit 3010 detects the 3× input voltage. The pull-up driver 3002 and pull-down driver 3004 are turned off. The very high (3×) input voltage at the pad triggers cross control circuit 3010 to output 2× voltage at nodes A, B, and C, and 3× voltage at nodes D and W. In some embodiments, the cross-control circuit 3010 outputs between 1 and 2 times the operational voltage to the node A, the node B, and the node C; and the cross-control circuit 3010 outputs three times the operational voltage to the node D and the N-well when the cross-control circuit detects two to three times the operational voltage at the input/output pad.

Figure 6:
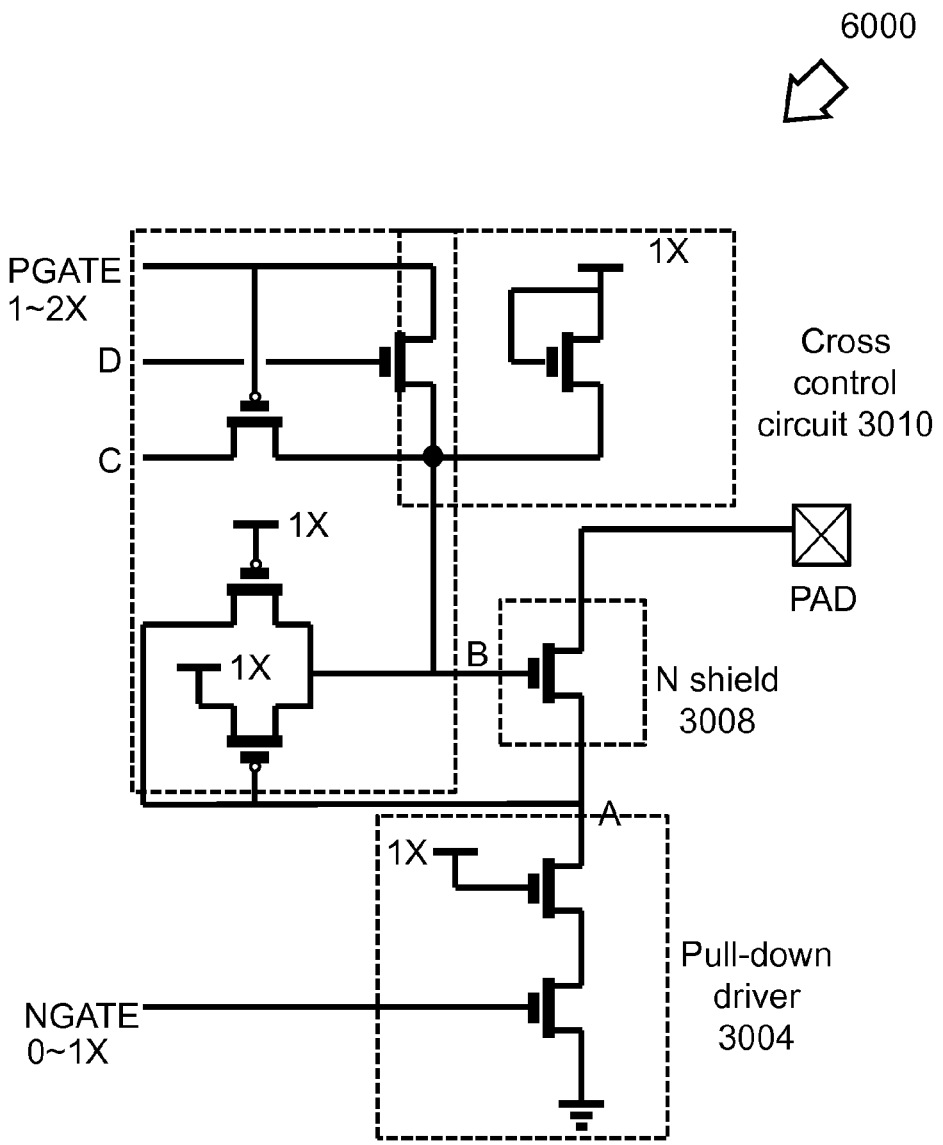
FIG. 6 is an depicting an implementation of an N-shield, a cross-control circuit and a pull-down driver circuit.

FIG. 6 is an embodiment of a portion 6000 of an input voltage tolerant device 3000 depicting an implementation of a cross-control circuit 3010, N-shield 3008 and a pull-down driver circuit 3004, designed in accordance with an embodiment of the present disclosure. Other circuit elements are disclosed in the remaining figures.

As shown, N-shield 3008 may be a single n-type transistor controlled by the cross-control circuit 3010 and coupled to the pull-down driver 3004 and the input/output pad.

Pull down-driver 3004 may be implemented as two additional n-type transistors in series, connected source-to-drain, with one of the n-type transitors being controlled via a pull-down driver control NGATE. It is understood by those familiar with the art that other pull down drivers in the art may be substituted.

FIG. 6 further depicts a section of cross-control circuit 3010, which receives input/output voltages from nodes B, C and D, and pull-up driver control PGATE.

Figure 7:
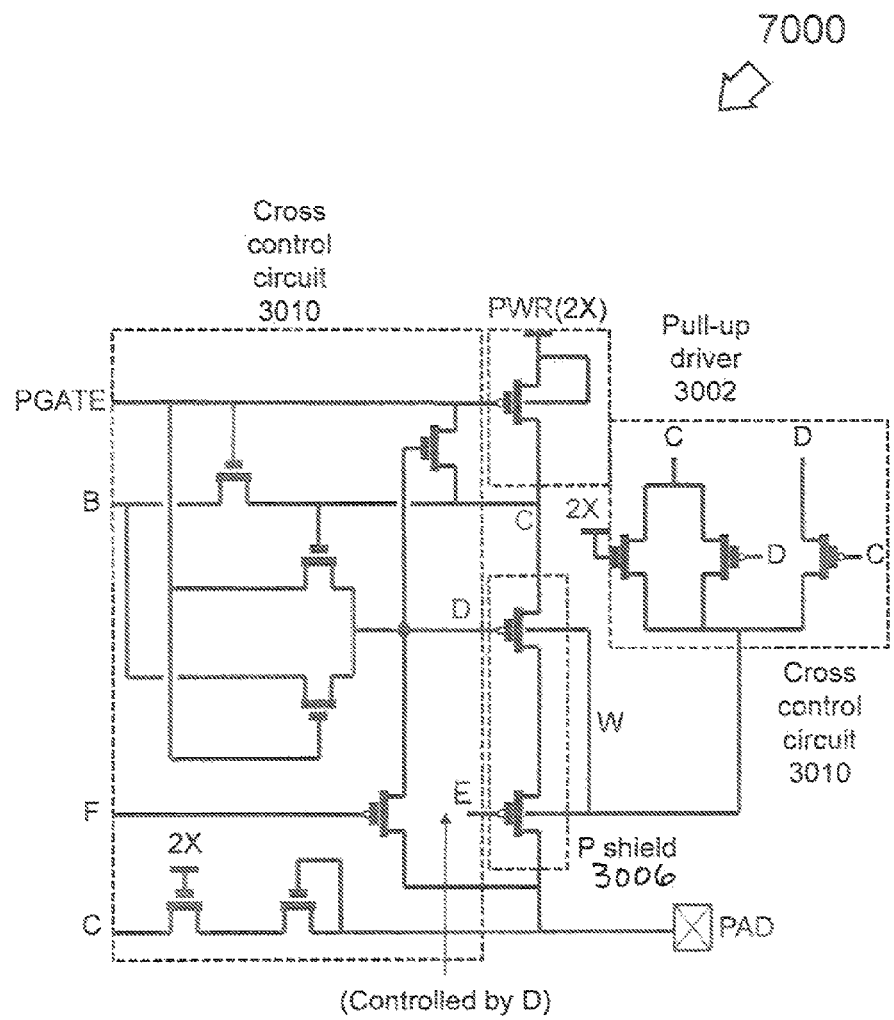
FIG. 7 illustrates an implementation of a cross-control circuit, P-shield and a pull-up driver circuit.

FIG. 7 is an embodiment of a portion of an input voltage tolerant device 3000 depicting an implementation of a cross-control circuit 3010, P-shield 3006 and a pull-up driver circuit 3002, designed in accordance with an embodiment of the present disclosure.

As shown, P-shield 3006 may be two p-type transistor controlled by the cross-control circuit 3010 (at node D) and coupled to the pull-up driver 3002 and the input/output pad.

In this embodiment, pull up driver 3002 may be implemented as a p-type transistors being controlled via a pull-up driver control PGATE.

FIG. 7 further depicts another section of cross-control circuit 3010, which receives input/output voltages from nodes B, C and D, and pull-up driver control PGATE. Cross-control circuit 3010 also receives input/output voltages from pad and "node F", as depicted in FIG. 8.

Figure 8:
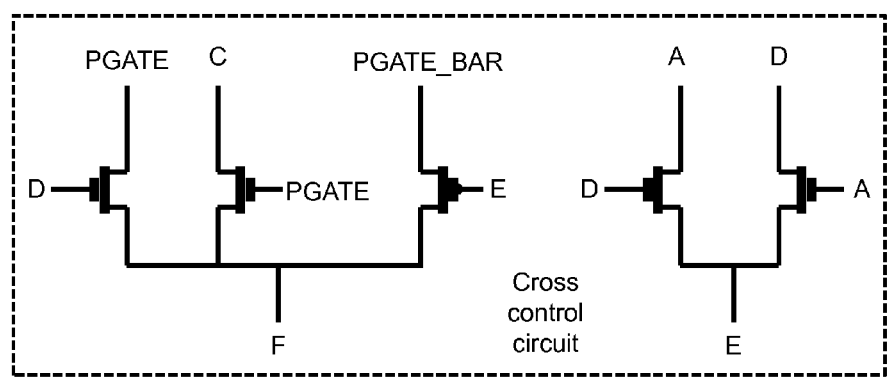
FIG. 8 is an embodiment of a portion of the cross-control circuit, which provides signal to a portion of the cross-control circuit in FIG. 7.

FIG. 8 is a portion of an embodiment of a cross-control circuit for use in an input voltage tolerant device, designed in accordance with an embodiment of the present disclosure. Nodes F and nodes E in FIG. 8 are connected the nodes of the same name of FIG. 7.

The PGATE_BAR indicates the reverse phase (180 degree shift) signal of PGATE. For example, if PGATE=0 then PGATE_BAR=1.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. A voltage tolerant input/output circuit designed to be coupled to an input/output pad, the circuit comprising:
   a pull-up driver to be coupled to a power supply;
   a P-shield with an N-well to be coupled to the pull-up driver at a node C, the P-shield being further coupled to the input/output pad;
   an N-shield to be coupled to the input/output pad;
   a pull-down driver to be coupled between ground and the N-shield at a node A; and
   a cross-control circuit configured to detect voltage at: the node A, the node C, and the input/output pad; the cross-control circuit being further configured to output control signals to the P-shield and the N-shield based on the detected voltages.

2. The voltage tolerant input/output circuit of claim 1, wherein the power supply is approximately twice an operational voltage of the input/output circuit.

3. The voltage tolerant input/output circuit of claim 2, wherein the P-shield comprises a P-type transistor with a p-transistor source connected to the pull-up driver at the node C, a p-transistor gate connected to the cross-control circuit at a node D, and a p-transistor drain connected to the input/output pad.

4. The voltage tolerant input/output circuit of claim 3, wherein the N-shield comprises a N-type transistor with an n-transistor source connected to the pull-down driver at the node A, an n-transistor gate connected to the cross-control circuit at a node B, and an n-transistor drain connected to the input/output pad.

5. The voltage tolerant input/output circuit of claim 4, wherein the cross-control circuit outputs the operational voltage (of 0-1× voltage) to: the node C and the node D when the cross-control circuit detects zero volts at the node A.

6. The voltage tolerant input/output circuit of claim 4, wherein the cross-control circuit outputs twice the operational voltage to: the node A, the node B, and the N-well, and the cross-control circuit outputs the operational voltage to the node D, when the cross-control circuit detects a voltage approximately twice the operational voltage at the node C.

7. The voltage tolerant input/output circuit of claim 4, wherein the cross-control circuit outputs the operational voltage to: the node A, the node B, and the no D, and the cross-control circuit outputs twice the operational voltage to the N-well, when the cross-control circuit detects a voltage approximately twice the operational voltage at the node C.

8. The voltage tolerant input/output circuit of claim 4, wherein the cross-control circuit outputs a voltage between a range of zero volts to the operational voltage to: the node A, the node B, the node C, the node D and the N-well, when the cross-control circuit detects zero voltage at the input/output pad.

9. The voltage tolerant input/output circuit of claim 4, wherein the cross-control circuit outputs twice the operational voltage to: the node A, the node B, and the node C and the cross-control circuit outputs three times the operational voltage to: the node D and the N-well, when the cross-control circuit detects three times the operational voltage at the input/output pad.

10. The voltage tolerant input/output circuit of claim 4, wherein an electro static discharge device is connected between the P-shield p-transistor drain and the input/output pad.

11. The voltage tolerant input/output circuit of claim 4, wherein an electro static discharge device is connected between the N-shield n-transistor drain and the input/output pad.

12. The voltage tolerant input/output circuit of claim 4, wherein a first electro static discharge device is connected between the N-shield n-transistor drain and the input/output pad and a second electro static discharge device is connected between the P-shield p-transistor drain and the input/output pad.

13. The voltage tolerant input/output circuit of claim 12, wherein the cross-control circuit outputs the operational voltage (of 0-1× voltage) to: the node C and the node D when the cross-control circuit detects zero volts at the node A.

14. The voltage tolerant input/output circuit of claim 12, wherein the cross-control circuit outputs twice the operational voltage to: the node A, the node B, and the N-well, and the cross-control circuit outputs the operational voltage to the node D, when the cross-control circuit detects a voltage approximately twice the operational voltage at the node C.

15. The voltage tolerant input/output circuit of claim 12, wherein the cross-control circuit outputs the operational voltage to: the node A, the node B, and the node D, and the cross-control circuit outputs twice the operational voltage to the N-well, when the cross-control circuit detects a voltage approximately twice the operational voltage at the node C.

16. The voltage tolerant input/output circuit of claim 12, wherein the cross-control circuit outputs a voltage between a range of zero volts to the operational voltage to: the node A, the node B, the node C, the node D and the N-well, when the cross-control circuit detects zero voltage at the input/output pad.

17. The voltage tolerant input/output circuit of claim 12, wherein the cross-control circuit outputs twice the operational voltage to: the node A, the node B, and the node C and the cross-control circuit outputs three times the operational voltage to: the node D and the N-well, when the cross-control circuit detects three times the operational voltage at the input/output pad.

18. The voltage tolerant input/output circuit of claim 12, wherein the cross-control circuit outputs a voltage between the 1-2× the operational voltage to: the node A, the node B, and the node C and the cross-control circuit outputs three times the operational voltage to: the node D and the N-well, when the cross-control circuit detects two times the operational voltage at the input/output pad.

19. The voltage tolerant input/output circuit of claim 14, wherein the cross-control circuit outputs a voltage between 1-2× the operational voltage to: the node A, the node B, and the node C and the cross-control circuit outputs three times the operational voltage to: the node D and the N-well, when the cross-control circuit detects two times the operational voltage at the input/output pad.

20. The voltage tolerant input/output circuit of claim 4, wherein the cross-control circuit outputs a voltage between a range of 1-2× the operational voltage to: the node A, the node B, the node C, and the node D, when the cross-control circuit detects 2× voltage at the input/output pad.

21. The voltage tolerant input/output circuit of claim 12, wherein the cross-control circuit outputs a voltage between a range of 1-2× the operational voltage to: the node A, the node B, the node C, and the node D, when the cross-control circuit detects 2× voltage at the input/output pad.

* * * * *

UNITED STATES PATENT AND TRADEMARK OFFICE
CERTIFICATE OF CORRECTION

PATENT NO.         : 8,610,488 B2                                                Page 1 of 1
APPLICATION NO.    : 13/349152
DATED              : December 17, 2013
INVENTOR(S)        : Yu et al.

It is certified that error appears in the above-identified patent and that said Letters Patent is hereby corrected as shown below:

In the Claims,

Claim 1, Column 5, Line 36 – delete the word "voltage" and insert -- voltages --.

Claim 4, Column 5, Line 51 – delete the word "a" and insert -- an --.

Claim 7, Column 6, Line 1 – delete the word "no" and insert -- node --.

Signed and Sealed this
Seventeenth Day of February, 2015

Michelle K. Lee
*Deputy Director of the United States Patent and Trademark Office*